United States Patent
Chang (10) Patent No.: US 7,122,417 B2
(45) Date of Patent: Oct. 17, 2006

(54) METHODS FOR FABRICATING METAL-OXIDE-SEMICONDUCTOR FIELD EFFECT TRANSISTORS USING GATE SIDEWALL SPACERS

(75) Inventor: Dong-Soo Chang, Kyungki-do (KR)

(73) Assignee: Samsung Electronics Co., Ltd., (KR)

( * ) Notice: Subject to any disclaimer, the term of this patent is extended or adjusted under 35 U.S.C. 154(b) by 134 days.

(21) Appl. No.: 10/776,016

(22) Filed: Feb. 10, 2004

(65) Prior Publication Data

US 2004/0203197 A1     Oct. 14, 2004

(30) Foreign Application Priority Data

Feb. 11, 2003  (KR) .................. 10-2003-0008570

(51) Int. Cl.
*H01L 21/8238* (2006.01)
*H01L 1/336* (2006.01)
*H01L 21/265* (2006.01)

(52) U.S. Cl. .............. 438/231; 438/199; 438/305; 438/519

(58) Field of Classification Search ............. 438/199, 438/301, 302, 303, 305, 514, 519, 525, 231
See application file for complete search history.

(56) References Cited

U.S. PATENT DOCUMENTS

| | | | |
|---|---|---|---|
| 4,642,878 A | 2/1987 | Maeda | |
| 5,943,565 A * | 8/1999 | Ju .................... | 438/231 |
| 6,153,455 A | 11/2000 | Ling et al. | |
| 6,245,619 B1 | 6/2001 | Boyd et al. | |
| 6,323,077 B1 | 11/2001 | Guo | |
| 6,632,718 B1 * | 10/2003 | Grider et al. ........... | 438/305 |
| 2001/0025994 A1 * | 10/2001 | Yoshino et al. ......... | 257/369 |
| 2002/0001910 A1 * | 1/2002 | Chen et al. ............ | 438/305 |
| 2002/0164847 A1 * | 11/2002 | Kim et al. ............ | 438/199 |

FOREIGN PATENT DOCUMENTS

| | | |
|---|---|---|
| JP | 2001-274263 | 10/2001 |
| KR | 1020000000919 A | 1/2000 |
| KR | 2001-0086315 A | 9/2001 |
| KR | 1020020085067 A | 11/2002 |

OTHER PUBLICATIONS

S. Wolf and R.N. Tauber, Silicon Processing for the VLSI Era, vol. 1, Second Edition, Lattice Press, 2000, p. 834.*
Wolf, Silicon Processing for the VLSI Era, vol. 3, Lattice Press, 1995, pp. 308-309.*

(Continued)

*Primary Examiner*—Laura M. Schillinger
*Assistant Examiner*—Heather Doty
(74) *Attorney, Agent, or Firm*—Myers Bigel Sibley & Sajovec (57) ABSTRACT

Metal-Oxide-Semiconductor Field Effect Transistor (MOS-FET) is fabricated by forming gate spacers on both sidewalls of a gate pattern in a semiconductor substrate including first and second regions. Then, a first impurity region is formed in the semiconductor substrate at the first region, and the gate spacer exposed at the first region is removed. A second impurity region is formed in the semiconductor substrate at the first region. A third impurity region is formed at the semiconductor substrate in the second region, and the gate spacer exposed at the second region is removed. A fourth impurity region is formed in the semiconductor substrate at the second region. The first and third impurity regions are formed deeper than the second and fourth impurity regions.

6 Claims, 7 Drawing Sheets

OTHER PUBLICATIONS

Wolf, Silicon Processing for the VLSI Era, vol. 3, Lattice Press, 1995, pp. 289, 305-307.*

Notice to File a Response/Amendment to the Examination Report, Korean Application No. 10-2003-0008570, Jan. 18, 2005.

* cited by examiner

Fig. 1

(Prior Art)

Fig. 2

(Prior Art)

Fig. 3

(Prior Art)

Fig. 4

(Prior Art)

Fig. 5

(Prior Art)

Fig. 6

(Prior Art)

Fig. 7

(Prior Art)

Fig. 15 ized. Additionally, in some embodiments, removing the gate
METHODS FOR FABRICATING METAL-OXIDE-SEMICONDUCTOR FIELD EFFECT TRANSISTORS USING GATE SIDEWALL SPACERS

RELATED APPLICATION

This application claims the benefit of Korean Patent Application No. 2003-008570, filed Feb. 11, 2003, the disclosure of which is hereby incorporated herein by reference in its entirety as if set forth fully herein.

BACKGROUND OF THE INVENTION

1. Field of the Invention

The present invention relates to semiconductor devices, and more specifically, to methods of fabricating Metal-Oxide-Semiconductor Field Effect Transistors (MOSFET).

2. Description of Related Art

Metal-Oxide-Semiconductor Field Effect Transistors (MOSFET) are widely used in semiconductor (integrated circuit) devices. Many semiconductor devices today use complementary MOSFETs ("CMOSFET") that include N-type MOSFETs and P-type MOSFETs.

FIG. 1 through FIG. 7 are cross-sectional views for explaining a conventional method of fabricating a CMOSFET having source/drain regions with a Lightly Doped Drain (LDD) structure.

Figure 1:
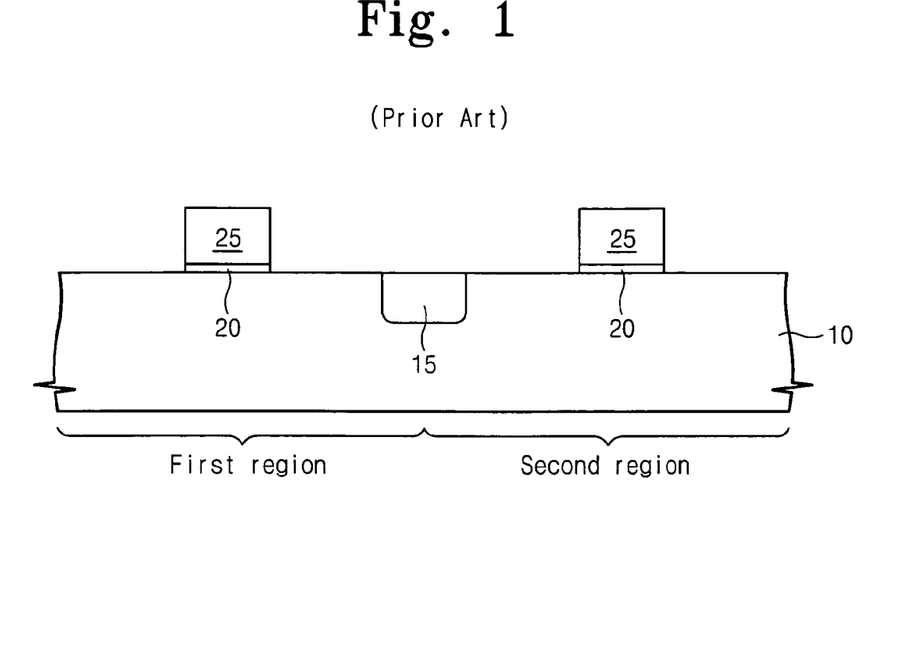
FIG. 1 to FIG. 7 are cross-sectional views illustrating a method of fabricating a metal-oxide-semiconductor field effect transistor (MOSFET) according to the prior art.
Figure 2:
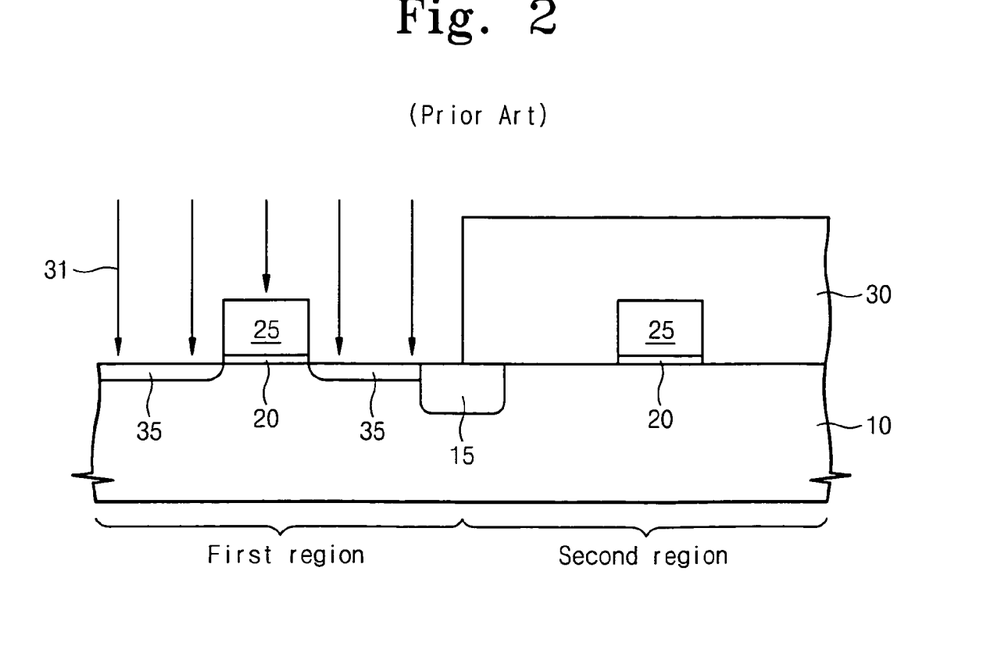
Figure 3:
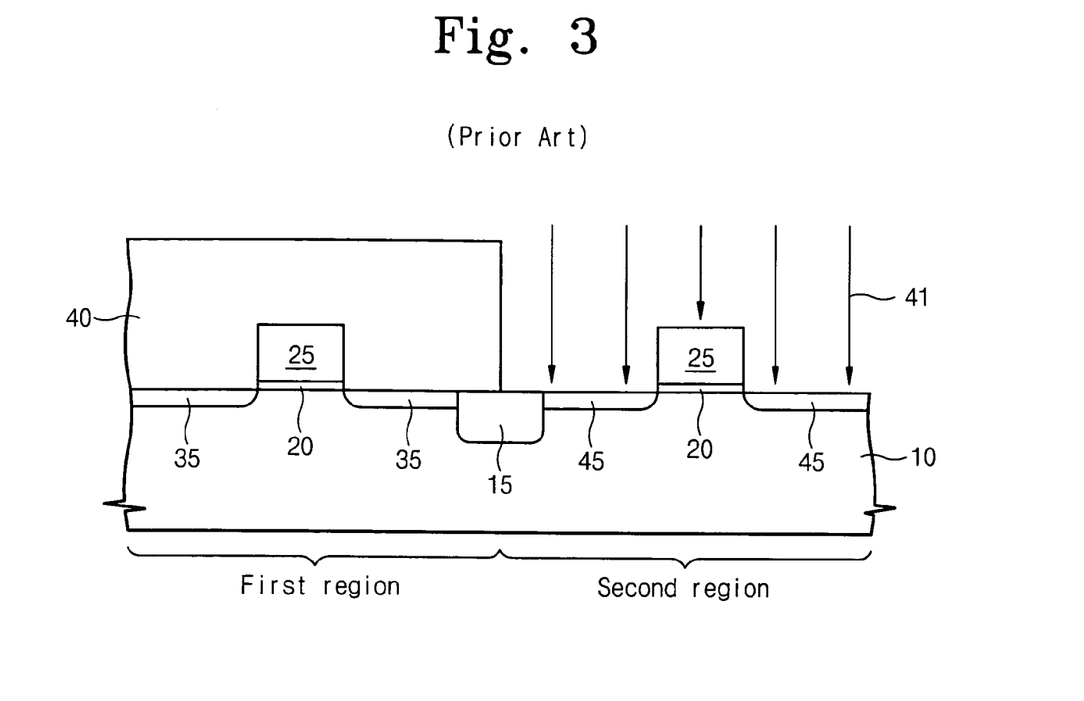
Figure 4:
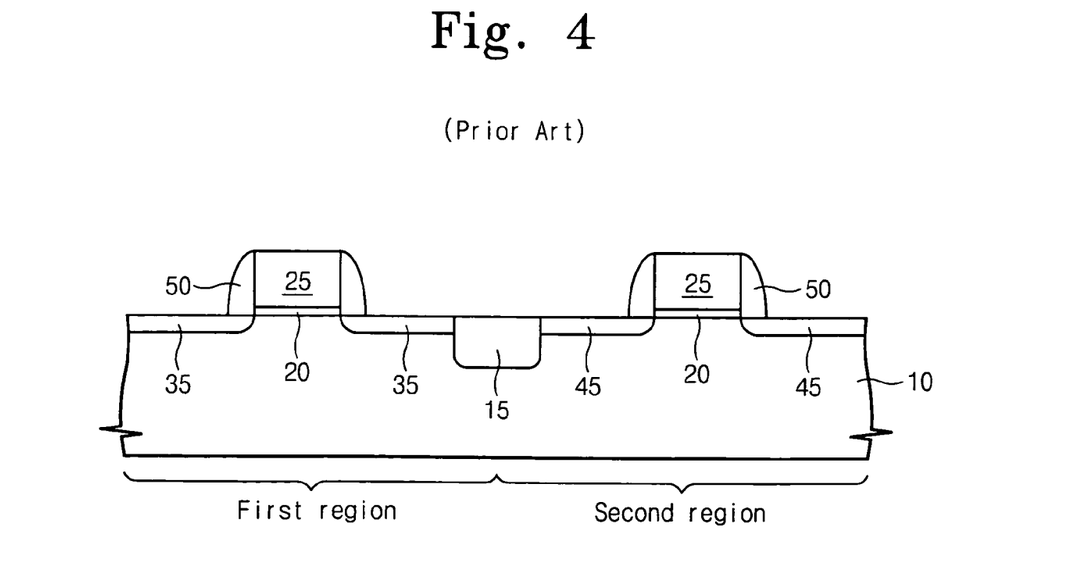
Figure 5:
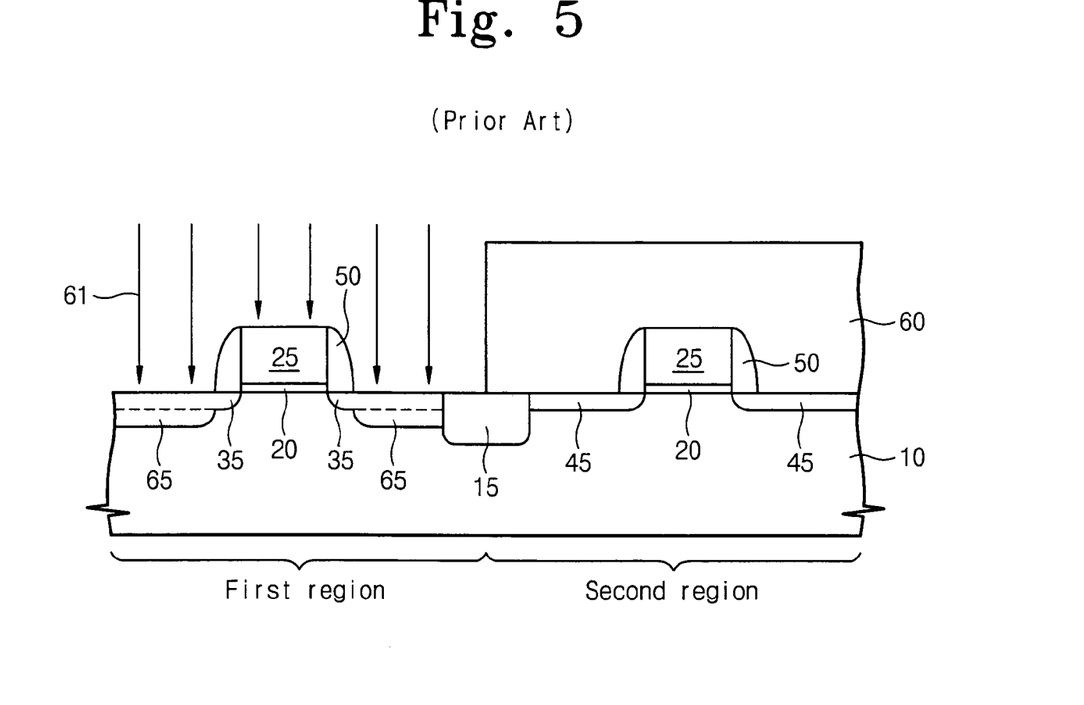
Figure 6:
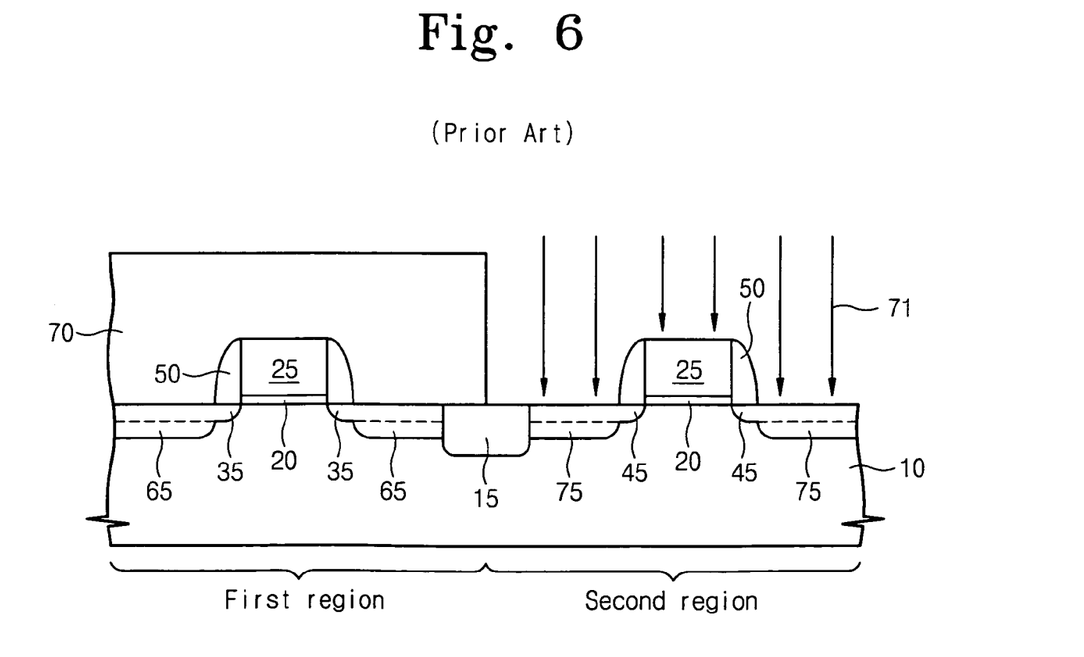
Figure 7:
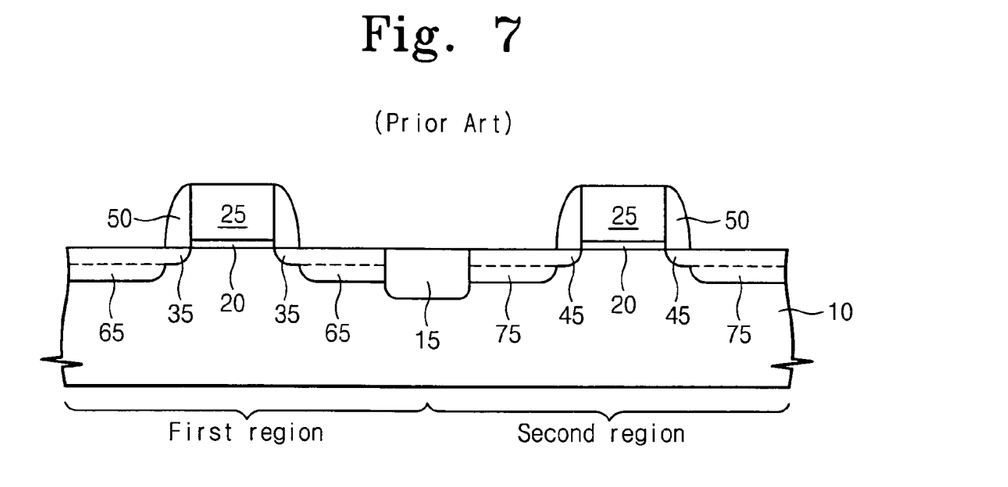

Referring to FIG. 1 through FIG. 3, a device isolation layer 15 that defines active regions is formed in a semiconductor substrate 10 having a first region and a second region. A gate insulation layer and a gate conductive layer are sequentially formed on the active region, and then patterned successively. Thus, a gate isolation pattern 20 and a gate conductive pattern 25, which are sequentially stacked on and intersect over the first region and the second region, are formed. The gate insulation layer pattern 20 and the gate conductive pattern 25 provide a gate pattern.

Then, a first mask 30 that covers the second region and exposes the first region is formed. A first low-concentration implantation 31 that uses the first mask 30 and a gate pattern exposed at the first region as an ion implantation mask is performed. Therefore, a first lightly doped region 35 is formed in the active region neighboring the gate pattern of the first region.

After removing the first mask 30, a second mask 40 that covers the first region is formed, exposing the second region. A second low-concentration implantation 41 that uses the second mask 40 and the gate pattern exposed at the second region as an ion implantation mask is performed. Thus, a second lightly doped region 45 is formed in the active region neighboring the gate pattern of the second region.

Referring to FIG. 4 through FIG. 7, after removing the second mask 40, gate spacers 50 are formed on both sidewalls of the gate pattern. The gate spacers 50 may reduce a short channel effect induced by excessive diffusion of high-concentration impurities that are implanted in a subsequent ion implantation processes. The short channel effect may result in punch-through, hot carrier effects and the like.

A third mask 60 is formed on the semiconductor substrate including the gate spacers 50 to cover the second region and expose the first region. A first ion implantation 61 that uses the third mask 60, the gate pattern exposed at the first region and the gate spacers 50 as an ion implantation mask is performed. As a result, a first heavily doped region 65 is formed in the active region neighboring the gate spacers 50 of the first region.

After removing the third mask 60, a fourth mask 70 is formed to cover the first region and expose the second region. Then, a second high-concentration implantation 71 that uses the fourth mask 70, the gate pattern exposed at the second region and the gate spacers 50 as an ion implantation mask is performed. As a result, a second heavily doped region 75 is formed in the active region neighboring the gate spacers 50 of the second region. Then, the fourth mask 70 is removed.

In the above method, most of the masks 30, 40, 60 and 70 are formed using a photolithographic process that may increase fabrication cost. Accordingly, it may be desirable that steps using a photolithographic process be decreased to reduce fabrication costs of a semiconductor product.

SUMMARY OF THE INVENTION

In some embodiments of the present invention, there are provided methods of fabricating a CMOSFET including forming a high-concentration region and a low-concentration region using one photoresist pattern. In some embodiments, these methods comprise forming a plurality of gate patterns on a first region and a second region of a semiconductor substrate, forming gate spacers on both sidewalls of the gate patterns and forming a first impurity region of a first conductivity type in the first region of the semiconductor substrate. The gate spacers exposed at the first region are removed. A second impurity region of the first conductivity type is formed in the first region, the second impurity region having shallower depth than the first impurity region. A third impurity region of a second conductivity type is formed in the second region. The gate spacers exposed at the second region are removed. A fourth impurity region of the second conductivity type is formed in the second region in the second region, the fourth impurity region having shallower depth than the third impurity region.

According to some embodiments, the first impurity region has higher impurity concentration than the second impurity region, and the third impurity region has higher impurity concentration than the fourth impurity region. Also, the first impurity region has higher impurity concentration than the second impurity region, and the fourth impurity region has impurity concentration as high as the third impurity region.

In some embodiments, the first impurity region is formed in the first region, using the gate pattern and the gate spacers as an ion implantation mask, and the second impurity region is formed in the first region, using the gate pattern as an ion implantation mask. In addition, the third impurity region is formed in the second region, using the gate pattern and the gate spacers as an ion implantation mask, and the fourth region is formed in the second region, using the gate pattern as an ion implantation mask.

In some embodiments, the gate spacers comprise at least one selected from the group consisting of silicon nitride, silicon oxynitride, silicon oxide, silicon carbide and silicon. Additionally, in some embodiments, removing the gate spacers may be performed by isotropic etching.

In other embodiments, a first HALO region and a second HALO region can be further formed using a first HALO ion implantation process and a second HALO ion implantation process, respectively, before forming the third impurity region and after forming the fourth impurity region. In some embodiments, the first HALO region is formed to cover sides of the first impurity region beneath the second impurity region and the second HALO region is formed to cover sides of the third impurity region beneath the fourth impurity region.

According to other embodiments, methods of fabricating CMOSFETs comprise forming a plurality of gate patterns on a first region and a second region of a semiconductor substrate, forming gate spacers on both sidewalls of the gate patterns, forming a first mask which covers the second region and exposes the first region and forming a first heavily doped region of a first conductivity type in the first region. The gate spacers which are exposed at the first region are removed. A first lightly doped region of the first conductivity type is formed in the first region. The first mask is removed. A second mask is formed which covers the first region and exposes the second region. A second heavily doped region of a second conductivity type is formed in the second region. The gate spacers which are exposed at the second region are removed. A second lightly doped region of the second conductivity type is formed in the second region, and the second mask is removed.

In some embodiments, the first-conductivity-type is N-type and the second-conductivity-type is P-type. Additionally, in some embodiments, forming the first heavily doped region can include an ion implantation process using the first mask, the gate pattern of the first region and the gate spacers as an ion implantation mask, and forming the first lightly doped region can include an ion implantation process using the first mask and the gate pattern of the first region as an ion implantation mask. In the same way, forming the second heavily doped region can include an ion implantation process using the second mask, the gate pattern of the second region and the gate spacers as an ion implantation mask and forming the second lightly doped region can include the ion implantation process using the first mask and the gate pattern of the first region as an ion implantation.

In some embodiments, the first and second lightly doped regions have shallower depth than the first and second heavily doped region, respectively. Additionally, in some embodiments, the gate spacers comprise at least one selected from the group consisting of silicon nitride, silicon oxynitride, silicon oxide, silicon carbide and silicon. The first and second masks may be a photoresist mask which is formed using a photolithographic process.

In other embodiments, first and second HALO regions may be further formed using a first and second HALO ion implantation processes, respectively, before removing the first and second masks. The first HALO ion implantation process may use the first mask and the gate pattern of the first region as an ion implantation mask, and the second HALO ion implantation process may use the second mask and the gate pattern of the second region as an ion implantation mask. The first HALO region covers the sides of the first heavily doped region beneath the first lightly doped region, and the second HALO region covers the sides of the second heavily doped region beneath the second lightly doped region. In some embodiments, the first HALO ion implantation process uses the impurities of the second conductivity type, and the second HALO ion implantation uses the impurities of first conductivity type.

According to still other embodiments, a plurality of the gate patterns are formed on the first and the second regions of a semiconductor substrate. Gate spacers are formed on both sidewalls of the gate pattern. A first mask covering the second region and exposing the first region is formed. A first lightly doped region of first conductivity type is formed on the semiconductor substrate of the first region, and the gate spacers are removed, and the first mask is removed. A second mask that covers the first region is formed, exposing the second region, and a third heavily doped region of second conductivity type is formed on the semiconductor substrate of the second region. The gate spacers are formed, the fourth heavily doped region of second conductivity type is formed, and the second mask is removed.

In some embodiments, the first-conductivity-type is N-type and the second-conductivity-type is P-type. Additionally, the first heavily doped region and third heavily doped region may be formed deeper than the second lightly doped region and fourth heavily doped region. In some embodiments, the concentration of the third heavily doped region is identical to that of the fourth heavily doped region.

According to other embodiments of the present invention, the first heavily doped region may be formed using the gate pattern and the gate spacers as an ion implantation mask in the semiconductor substrate of the first region. The second lightly doped region may be formed using the gate pattern as an ion implantation mask in the semiconductor substrate of the first region. The third heavily doped region may be formed using the gate pattern and the gate spacers as the ion implantation mask in the semiconductor substrate of the second region and the fourth heavily doped region may be formed using the gate pattern as the ion implantation mask in the semiconductor substrate of the second region.

Additionally, in some embodiments, first and second HALO regions may be further formed by performing a first and second HALO ion implantation process, respectively, before forming the third heavily doped region and after forming the fourth heavily doped region. The first and second HALO ion implantation processes may be further performed using the gate pattern of the first and second regions as an ion implantation mask. Additionally, the first HALO region may be formed to cover the bottom sides of the second low-concentration region beneath the second lightly doped region, and the second HALO region may be formed to cover the bottom sides of the third lightly doped region beneath the fourth heavily doped region. In some embodiments, the first and second HALO regions are performed using the impurities of P-type and N-type, respectively.

DESCRIPTION OF THE EXEMPLARY EMBODIMENT

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element such as a layer, region or substrate is referred to as being "on" another element, it can be directly on the other element or intervening elements may also be present. It will be understood that if part of an element, such as a surface of a conductive line, is referred to as "outer," it is closer to the outside of the integrated circuit than other parts of the element. Furthermore, relative terms such as "beneath" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements.

It will also be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

FIG. 8 to FIG. 14 are cross-sectional views illustrating methods of fabricating metal-oxide-semiconductor field effect transistors (MOSFET) according to embodiments of the present invention.

Figure 8:
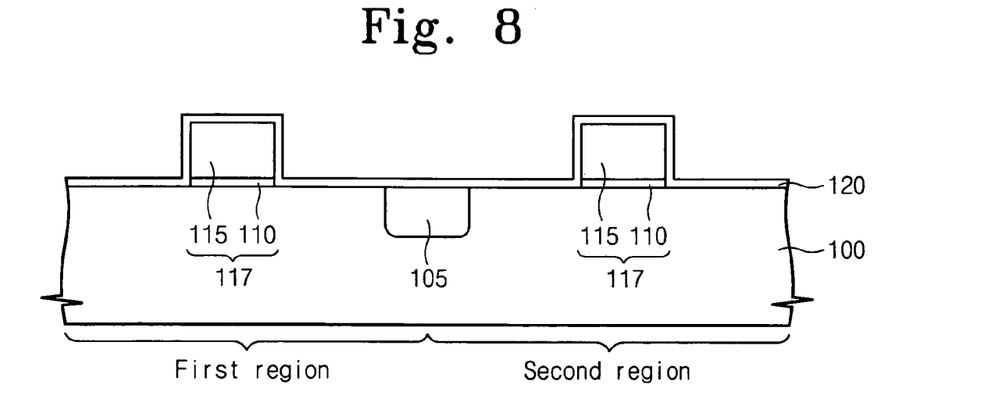
FIG. 8 to FIG. 14 are cross-sectional views illustrating methods of fabricating MOSFETs according to embodiments of the present invention.

Referring to FIG. 8, a semiconductor substrate 100 including a first region and a second region is prepared. The first region and second region comprise different conductivity types. For example, if an NMOSFET is formed at the first region, a PMOSFET is formed at the second region.

Then, a device isolation layer 105 defining an active region is formed at the predetermined region of the semiconductor substrate 100. A device isolation layer 105 may be formed using trench technology, LOCOS technology and/or other conventional techniques. Furthermore, before and/or after the device isolation layer 105 is formed, an ion implantation process may be further performed to form a well region. In some embodiments, a different kind of impurity ions may be implanted into the first region and the second region.

A plurality of gate patterns 117 are formed on the semiconductor substrate including the device isolation layer 105. The gate patterns 117 intersect over the active region and the device isolation layer 105. In some embodiments, the gate patterns 117 comprise a gate insulation layer pattern 110 and a gate conductive layer pattern 115, which are stacked sequentially.

In some embodiments, the step of forming the gate pattern 117 comprises forming a gate insulation layer and a gate conductive layer on a surface of the semiconductor substrate including an isolation layer 105 and patterning thereof. In this patterning stage, the gate patterns 117 intersect over the first region and/or second regions. In some embodiments, the gate insulation layer is formed by thermally oxidizing the active region. In addition, in some embodiments, the gate conductive layer comprises at least one selected from the group consisting of polysilicon, silicide, conductive nitride and conductive oxide. In addition, in some embodiments, at least one selected from the group consisting of a silicon oxide layer, a silicon nitride layer and a silicon oxynitride layer may be further formed on top of the gate conductive layer before the patterning stage.

A first insulation layer 120 is formed on the semiconductor substrate including the gate pattern 117. In some embodiments, the first insulation layer 120 may be selected from a silicon oxide layer, a silicon nitride layer and a silicon oxynitride layer. In some embodiments, the first insulation layer 120 is a silicon oxide layer formed using thermal oxidation or chemical vapor deposition (CVD).

Figure 9:
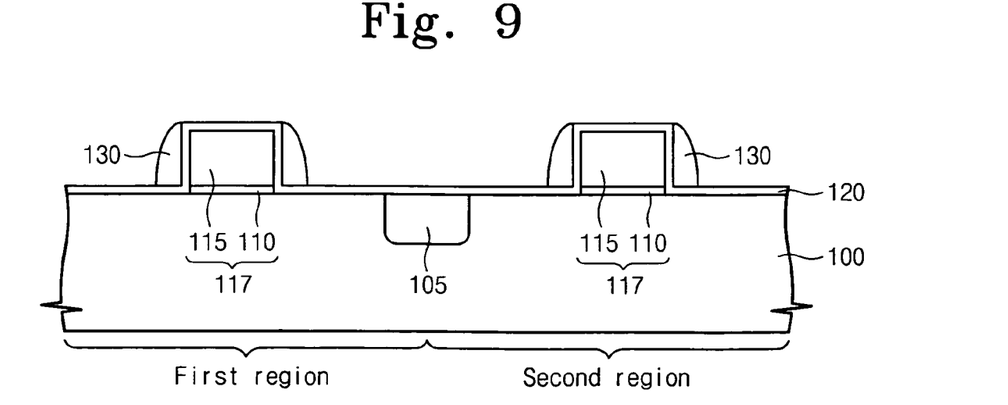

Referring to FIG. 9, a second insulation layer is formed on the surface of the semiconductor substrate including the first insulation layer 120. Then, the second insulation layer is anisotropically etched to expose a top surface of the first insulation layer 120. Thus, gate spacers 130 are formed on both sidewalls of the gate patterns 117.

In some embodiments, the second insulation layer, that is, the gate spacers 130, is formed of a material having etching selectivity with respect to the first insulation layer 120. According to these embodiments, etching damage on the active region or the gate pattern 117 can be reduced or minimized during the anisotropic etching process. Additionally, the second insulation layer may be formed of a material having etching selectivity with respect to the gate pattern 117 and a photoresist layer. According to some embodiments of the present invention, the second insulation layer may comprise at least one selected from a group consisting of a silicon nitride layer, a silicon oxide layer, a silicon oxynitride layer, a silicon carbide layer and a silicon layer.

Figure 10:
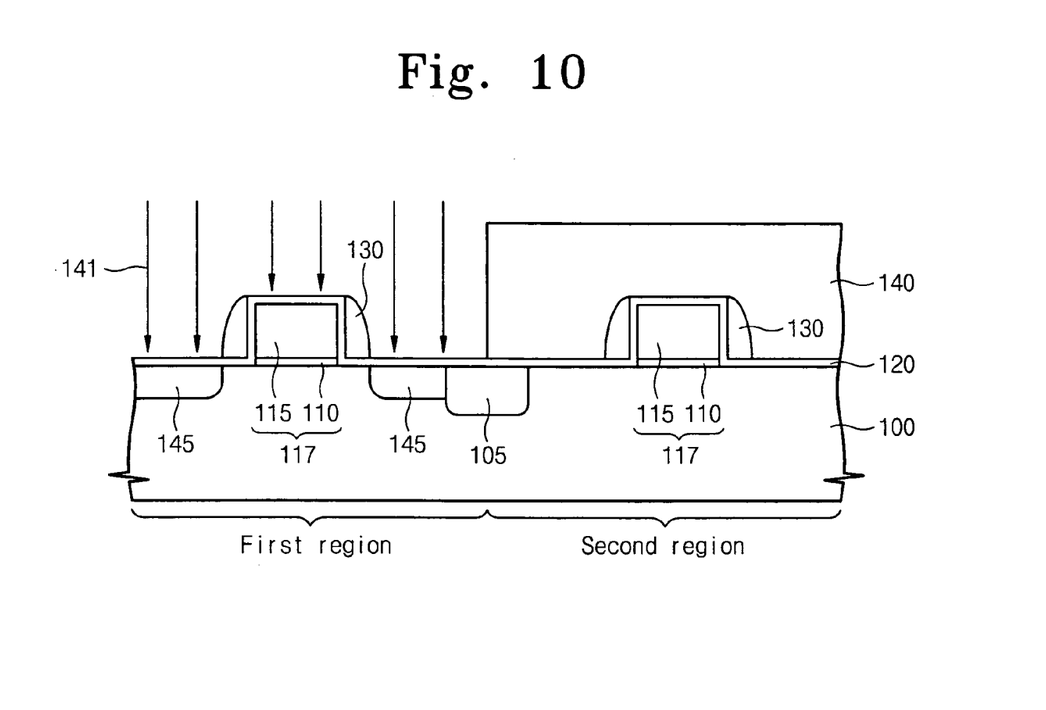

Referring to FIG. 10, a first mask 140 covering the second region and exposing the first region is formed on the semiconductor substrate including the gate spacers 130. In some embodiments, the first mask 140 is a photoresist layer formed using conventional photolithographic process. The gate spacers 130 and the first insulation layer 120 are exposed at the first region. Additionally, according to other embodiments of the present invention, the first insulation layer 120 is etched to expose the gate pattern 115 during forming the gate spacers 130.

A first high-concentration implantation 141 that uses the first mask 140, the gate pattern 117 and the gate spacers 130 as ion implantation mask is performed. As a result, a first heavily doped region 145 of the first depth, which is disposed in the semiconductor substrate 100 on both sides of gate pattern 117, is formed in the first region. The first heavily doped region 145 is defined by the gate pattern 117 and the gate spacers 130. The first heavily doped region 145 formed on both sides of the gate pattern 117 is used as the source/drain regions of the NMOSFET or the PMOSFET. According to some embodiments of the present invention, the first high-concentration implantation 141 uses N-type impurity.

Figure 11:
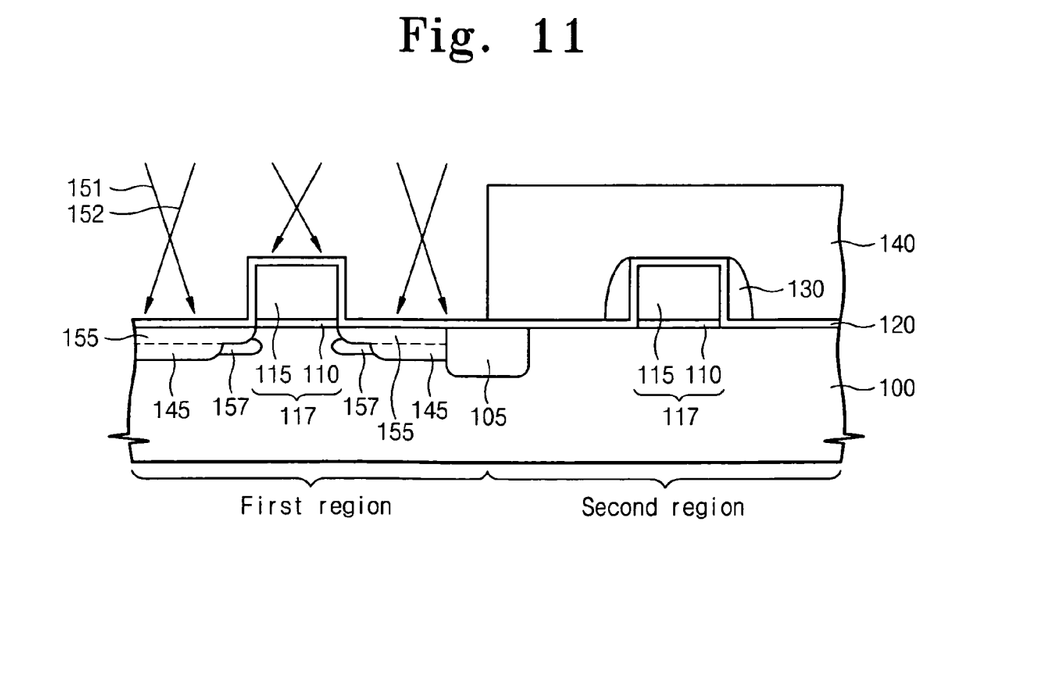

Referring to FIG. 11, after forming the first heavily doped region 145, the gate spacers 130 exposed at the first region are removed. The gate spacers 130 may be removed by performing an isotropic etching process that uses an etching recipe having etching selectivity with respect to the first mask 140 and the first insulation layer 120. Additionally, in some embodiments, the etching recipe has etching selectivity with respect to the gate pattern 117.

A first low-concentration implantation 151 is performed with respect to the semiconductor substrate without the gate spacers 130. According to some embodiments of the present invention, the first low-concentration implantation 151 uses the first mask 140 used in the first high-concentration implantation 141 and the gate pattern 117 of the first region as an ion implantation mask.

According to these embodiments, a first lightly doped region 155, which is defined by the width as the gate pattern 117 and disposed in the semiconductor substrate 100 around the gate pattern 117, is formed in the first region. Impurity ions used in the first low-concentration implantation 151 can be the same conductivity type as impurities used in the first high-concentration implantation 141. That is, according to some embodiments of the present invention, the first low-concentration implantation 151 uses N-type impurity. Additionally, the first low-concentration implantation 151 is performed with low energy and dose in comparison with the first high-concentration implantation 141. For this reason, the first lightly doped region 155 is formed to have a second depth, which is shallower than the first heavily doped region 145.

In other embodiments, a first HALO (high angle) implantation 152 may be performed in the semiconductor substrate without the gate spacers 130. The first HALO implantation 152 may be performed before and/or after the first low-concentration implantation 151. In the same way as the first low-concentration implantation 151, the first HALO implantation can use the first mask 140 and the gate pattern 117 of the first region as an ion implantation mask. In other embodiments, the first HALO ion implantation is performed with high energy as compared with the first low-concentration implantation. Thus, a first HALO region 157, which is disposed beneath the first lightly doped region 155 to cover sides of the first heavily doped region 145, is formed at the first region. The first HALO implantation 152 is carried out using conductive impurities different from those of the first high/low concentration implantation 151 and 141. That is, according to some embodiments of the present invention, the first HALO implantation 152 is performed using a P-type impurity.

The first high-concentration implantation 141, the fist low-concentration implantation 151 and the first HALO implantation 152 may be formed using a tilt ion implantation technique. In this technique, impurities are implanted into the semiconductor substrate at a tilt. The tilted angle may be about 1° through about 50° in some embodiments.

Figure 12:
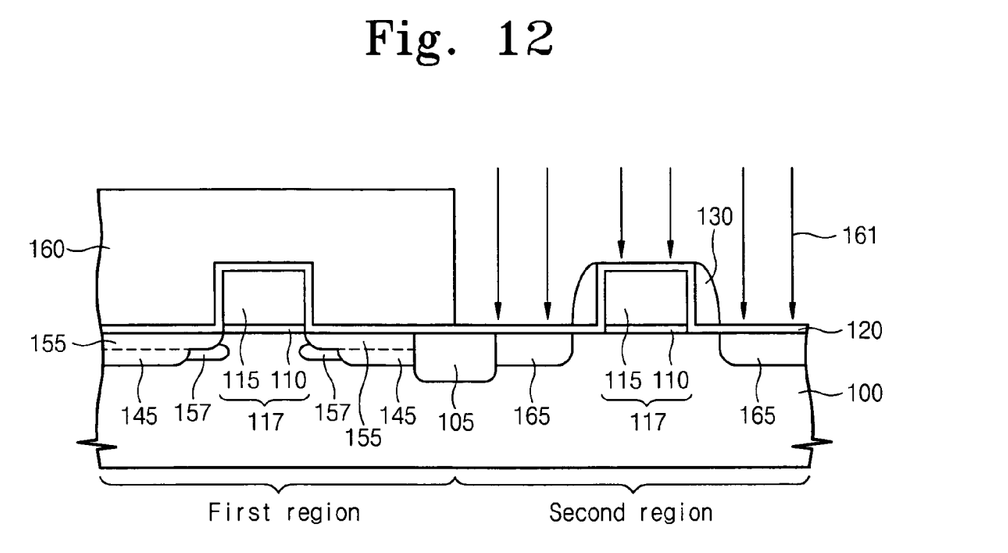

Referring to FIG. 12, the first mask 140 is removed. The step of removing the mask 140 may be performed to reduce or minimize damages with respect to the first insulation layer 120 and the gate spacers 130.

Then, a second mask 160, which covers the first region and exposes the second region, is formed. Thus, the gate spacers 130 and the first insulation layer 120 are exposed at the second region. In the same way as the first mask 140, in some embodiments, the second mask 160 is a photoresist layer formed by performing a conventional photolithographic process.

A second high-concentration implantation 161 that uses the second mask 160, the gate pattern 117 and the gate spacers 130 of the second region as an ion implantation mask is performed. As a result, a second heavily doped region 161 of the third depth, which is disposed in both sides of the semiconductor substrate 100 of the gate spacers 130, is formed in the second region. The second heavily doped region 165 is defined by the gate pattern 117 and the gate spacers 130. According to some embodiments of the present invention, the second ion implementation process 161 uses P-type impurity.

Figure 13:
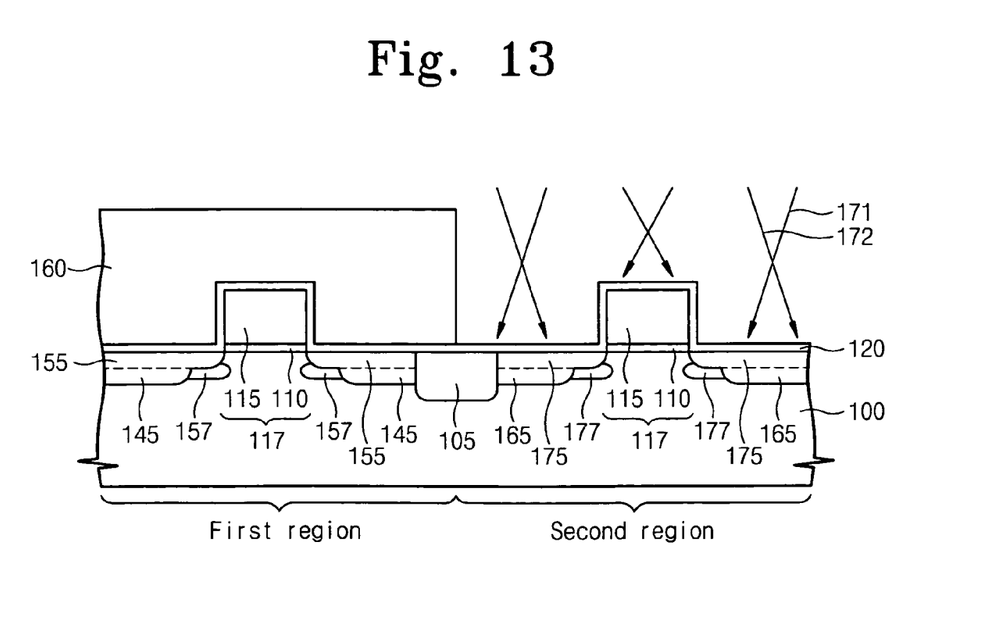

Referring to FIG. 13, after forming the second heavily doped region 165, the gate spacers 130 exposed at the second region are removed. In some embodiments, the gate spacers 130 are removed by performing an isotropic etching process using an etching recipe that has the etching selectivity with respect to the second mask 160 and the first insulation layer 120. Additionally, in some embodiments, the etching recipe has an etching selectivity with respect to the gate pattern 117.

With respect to the semiconductor substrate without the gate spacers 130, a second low-concentration implantation 171 is performed. According to some embodiments of the present invention, the second low-concentration implantation 171 uses the second mask 160 used at the second low-concentration implantation 161 and the gate pattern 117 of the second region as the ion implantation mask.

Thus, a second lightly doped region 175, which is disposed at the semiconductor substrate 100 around the gate pattern 117 and defined by the gate pattern 117, is formed in the second region. Impurity ions used in the second low-concentration implantation 171 may be the same conductivity type as impurities used in the second heavily doped implantation 161. That is, according to some embodiments of the present invention, the second low-concentration implantation 171 uses P-type impurity. Additionally, the second low-concentration implantation 171 is performed with low energy and dose as compared with the first-concentration implantation 161. Thus, the second lightly doped region 175 is formed with the fourth depth that is shallower than the second heavily doped region 165.

In other embodiments, the second HALO implantation 172 may be performed with respect to the semiconductor substrate without the gate spacers 130. The second HALO implantation 172 may be performed before and/or after the second low-concentration implantation 171. In the same way as the second low-concentration implantation 171, the second HALO implantation 172 can use the second mask 160 and the gate pattern 117 of the second region as the ion implantation mask. In other embodiments, the second HALO implantation is performed with high ion energy in comparison with the second low-concentration implantation 171. A second HALO region 177, which is disposed beneath the second lightly doped region 175 to cover sides of the second heavily doped region 165, is formed in the second region. The second HALO implantation 172 is carried out using conductive impurities different from the second high/low concentration implantation 161 and 171. That is, according to some embodiments of the present invention, the second HALO implantation 172 is performed using N-type impurity.

The second high-concentration implantation 161, the second low-concentration implantation 171 and the second HALO implantation 12 may be formed using a tilt ion implantation technique with respect to the semiconductor substrate 100. In this technique, impurities are implanted into the semiconductor substrate 100 at a tilt. The tilt angle may be about 1° through about 50°.

Figure 14:
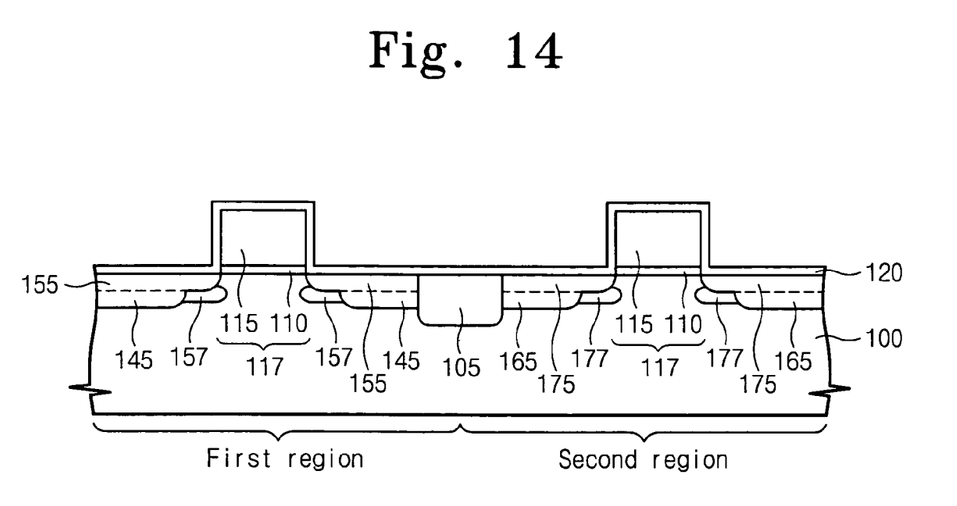

Referring to FIG. 14, the second mask 160 is removed. The second mask 160 may be removed by using an etching recipe having etching selectivity with respect to the first insulation layer 140 and the gate pattern 117.

Therefore, as shown in FIG. 14, MOSFETs having different conductivity type, LDD structure and HALO structure, are formed at the first and second regions.

Figure 15:
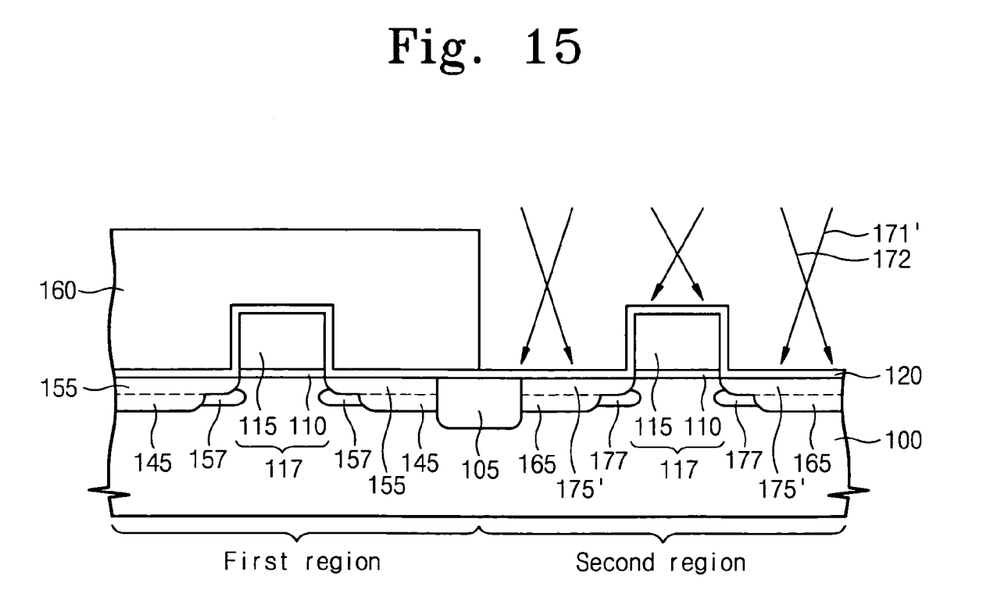
FIG. 15 is a cross-sectional view illustrating methods of fabricating MOSFETs according to other embodiments of the present invention.

In accordance with other embodiments of the present invention, instead of the second low-concentration implantation 171 illustrated in FIG. 13, a third ion implantation 171' may be performed (see FIG. 15). Conductivity type of impurities and the mask used in the third ion implantation 171' may be the same as those used in the second lightly doped implantation 171, in these embodiments. Additionally, the third ion implantation 171' may be performed under the same or similar conditions as the second heavily doped implantation 161. For example, the third ion implantation 171' may be performed at about 10 through about 100 percent of the dose condition of the second high-concentration implantation 161. Additionally, the third ion implantation 171' may be performed under the condition of low energy in comparison with the second high-concentration implantation 161. Thus, as previously mentioned, an impurity region 175' may be formed shallower than the second heavily doped region and may include impurities of the same concentration.

In accordance with other embodiments of the present invention, another ion implantation may be replaced by the first low-concentration implantation 151 in the first region. These embodiments thus can correspond to the relation between the second low-concentration implantation 171 and the third ion implantation. Accordingly, a description of those steps will be omitted here for brevity.

According to some embodiments the present invention, the heavily doped region and the lightly doped region are formed using one mask pattern. Thus, only two mask patterns may be used to fabricate a CMOSFET having the LDD structure. As a result, a process of fabricating semiconductor devices can be shortened. Additionally, the characteristic deterioration of the semiconductor by the short channel effect can be reduced or minimized because the MOSFET has the LDD structure. Furthermore, the punch-through effect can be reduced or minimized because the HALO region is formed without the need for additional masks. Consequently, semiconductor devices can be fabricated with low cost.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating a CMOSFET comprising:
    forming a plurality of gate patterns on a first region and a second region of a semiconductor substrate; then
    forming gate spacers on both sidewalls of the gate patterns; then
    forming a first impurity region of a first conductivity type in the first region of the semiconductor substrate; then
    removing the gate spacers exposed at the first region; then
    forming a second impurity region of the first conductivity type in the first region from which the gate spacers have been removed, the second impurity region having shallower depth than the first impurity region;
    forming a third impurity region of a second conductivity type in the second region; then
    removing the gate spacers exposed at the second region; and then
    forming a fourth impurity region of the second conductivity type in the second region, the fourth impurity region having shallower depth than the third impurity region;
    wherein the first impurity region has higher impurity concentration than the second impurity region; and
    wherein the fourth impurity region has impurity concentration as high as the third impurity region.

2. The method of fabricating the CMOSFET of claim 1,
    wherein the first impurity region is formed in the first region, using the gate pattern and the gate spacers as an ion implantation mask;
    wherein the second impurity region is formed in the first region, using the gate pattern as an ion implantation mask;
    wherein the third impurity region is formed in the second region, using the gate pattern and the gate spacers as an ion implantation mask; and
    wherein the fourth region is formed in the second region, using the gate pattern as an ion implantation mask.

3. The method of fabricating the CMOSFET of claim 1, wherein the gate spacers comprise at least one selected from the group consisting of silicon nitride, silicon oxynitride, silicon oxide, silicon carbide and silicon.

4. The method of fabricating the CMOSFET of claim 1, wherein removing the gate spacers at the first region and second region are performed by isotropic etching.

5. The method of fabricating the CMOSFET of claim 1, wherein, before forming the third impurity region, a first HALO ion implantation is performed to form a first HALO region,
    wherein the first HALO region is formed to cover sides of the first impurity region beneath the second impurity region.

6. The method of fabricating the CMOSFET of claim 1, Wherein after forming the fourth impurity region, a second HALO ion implantation is performed to form a second HALO region; and
    wherein the second HALO region is formed to cover sides of the third impurity region beneath the fourth impurity region.

* * * * *